(12) United States Patent
Li et al.

(10) Patent No.: US 8,009,546 B2
(45) Date of Patent: Aug. 30, 2011

(54) OVER CURRENT PROTECTION DEVICE

(75) Inventors: Shengyuan Li, Dallas, TX (US);
Akihiko Doi, Tokyo (JP)

(73) Assignee: Texas Instruments Incorporated,
Dallas, TX (US)

( * ) Notice: Subject to any disclaimer, the term of this patent is extended or adjusted under 35 U.S.C. 154(b) by 119 days.

(21) Appl. No.: 12/613,419

(22) Filed: Nov. 5, 2009

(65) Prior Publication Data

US 2010/0315924 A1    Dec. 16, 2010

Related U.S. Application Data

(60) Provisional application No. 61/186,226, filed on Jun. 11, 2009.

(51) Int. Cl.
*G11B 7/00* (2006.01)
(52) U.S. Cl. ....................................... 369/116
(58) Field of Classification Search ................. None
See application file for complete search history.

(56) References Cited

U.S. PATENT DOCUMENTS

| | | | |
|---|---|---|---|
| 4,796,250 A * | 1/1989 | Kobayashi et al. ........ | 369/53.26 |
| 6,178,101 B1 * | 1/2001 | Shires ............................. | 363/39 |
| 6,359,847 B1 * | 3/2002 | Shimizu ...................... | 369/53.26 |
| 2005/0047316 A1 * | 3/2005 | Yamamoto ..................... | 369/116 |
| 2005/0105451 A1 * | 5/2005 | Tsai et al. ..................... | 369/116 |
| 2007/0230313 A1 * | 10/2007 | Kawasumi .................... | 369/116 |
| 2010/0315915 A1 * | 12/2010 | Li et al. ......................... | 369/47.5 |
| 2010/0315924 A1 * | 12/2010 | Li et al. ......................... | 369/53.2 |

* cited by examiner

*Primary Examiner* — Peter Vincent Agustin
(74) *Attorney, Agent, or Firm* — Dawn V. Stephens; Wade James Brady, III; Frederick J. Telecky, Jr.

(57) ABSTRACT

An over current protection device is described. It includes a plurality of input channels for receiving an input signal; a plurality of low pass filters coupled to a first group of the plurality of input channels, wherein each low pass filter is associated with one input channel within the first group of input channels, the plurality of low pass filters operative for removing spikes in associated with the input signal; and a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level, wherein the over current protection device is on chip with the laser diode driver.

17 Claims, 7 Drawing Sheets

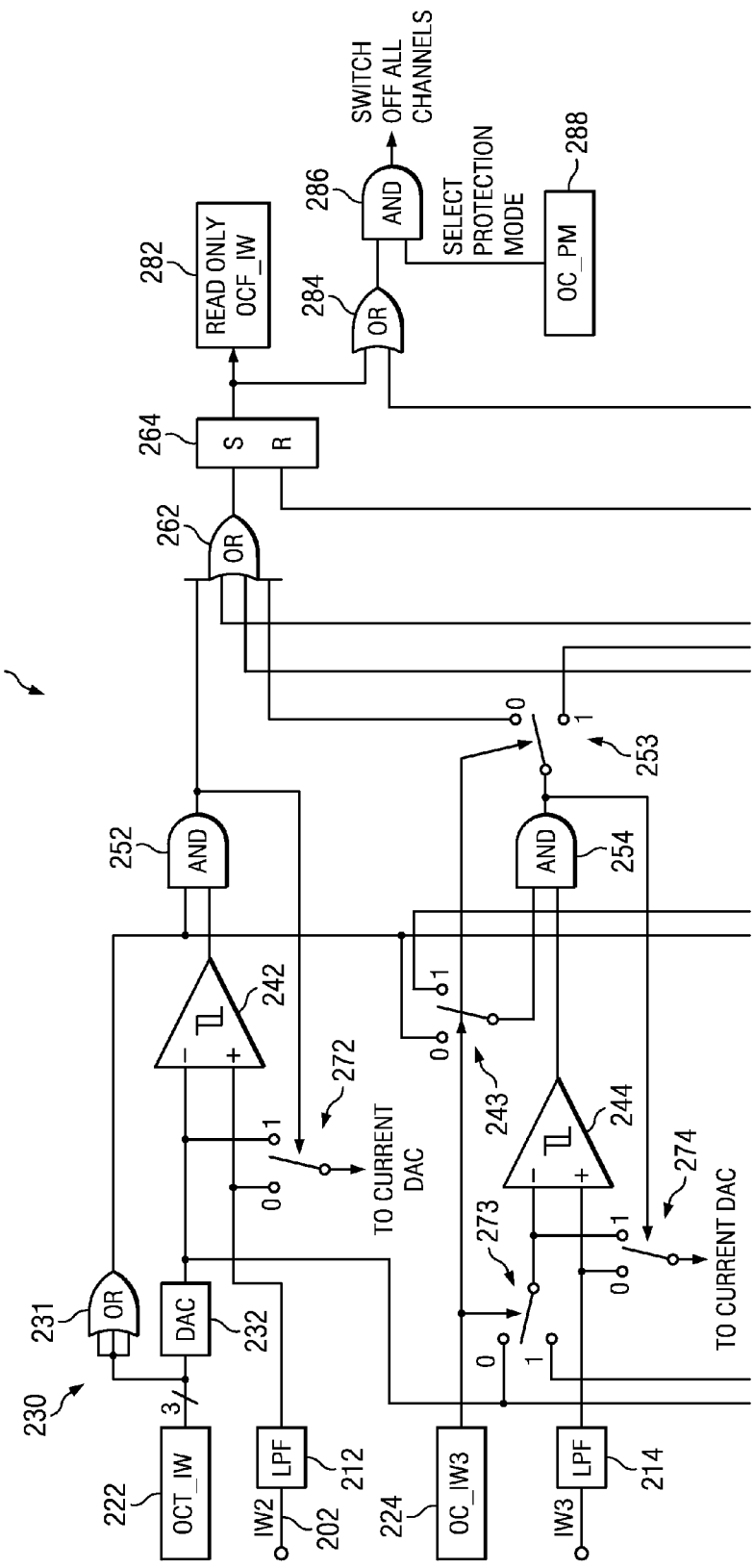

VCC ▷
GND ▷

IF R=1, S NEED TO BE 0,
IF R=0, S STAYS THE SAME
=> SOUT = Rbar*S = (R + Sbar)bar
& ROUT = R = (Rbar + 0)bar

OVER CURRENT PROTECTION DEVICE

CROSS REFERENCE TO RELATED APPLICATION(S)

The present application, claims priority to jointly owned U.S. Provisional Application corresponding to application No. 61/186,226 entitled, "Over Current Protection Device." This provisional application was filed on Jun. 11, 2009.

DESCRIPTION OF RELATED ART

With the evolution of electronic devices, there is a continual demand for enhanced speed, capacity and efficiency in various areas including electronic data storage. Motivators for this evolution may be the increasing interest in video (e.g., movies, family videos), audio (e.g., songs, hooks), and images (e.g., pictures). Optical disk drives have emerged as one viable solution for supplying removable high capacity storage. When these drives include light sources, signals sent to these sources should be properly processed to reduce potential damage and maintain appropriate light emission.

BRIEF DESCRIPTION OF THE DRAWINGS

The over current protection device may be better understood with reference to the following figures. The components within the figures are not necessarily to scale, emphasis instead being placed upon clearly illustrating the principles of the invention. Moreover, in the figures, like reference numerals designate corresponding parts or blocks throughout the different views.

FIGS. 2A-2B are block diagrams illustrating one implementation of the OCPD 125.

Figure 1A:
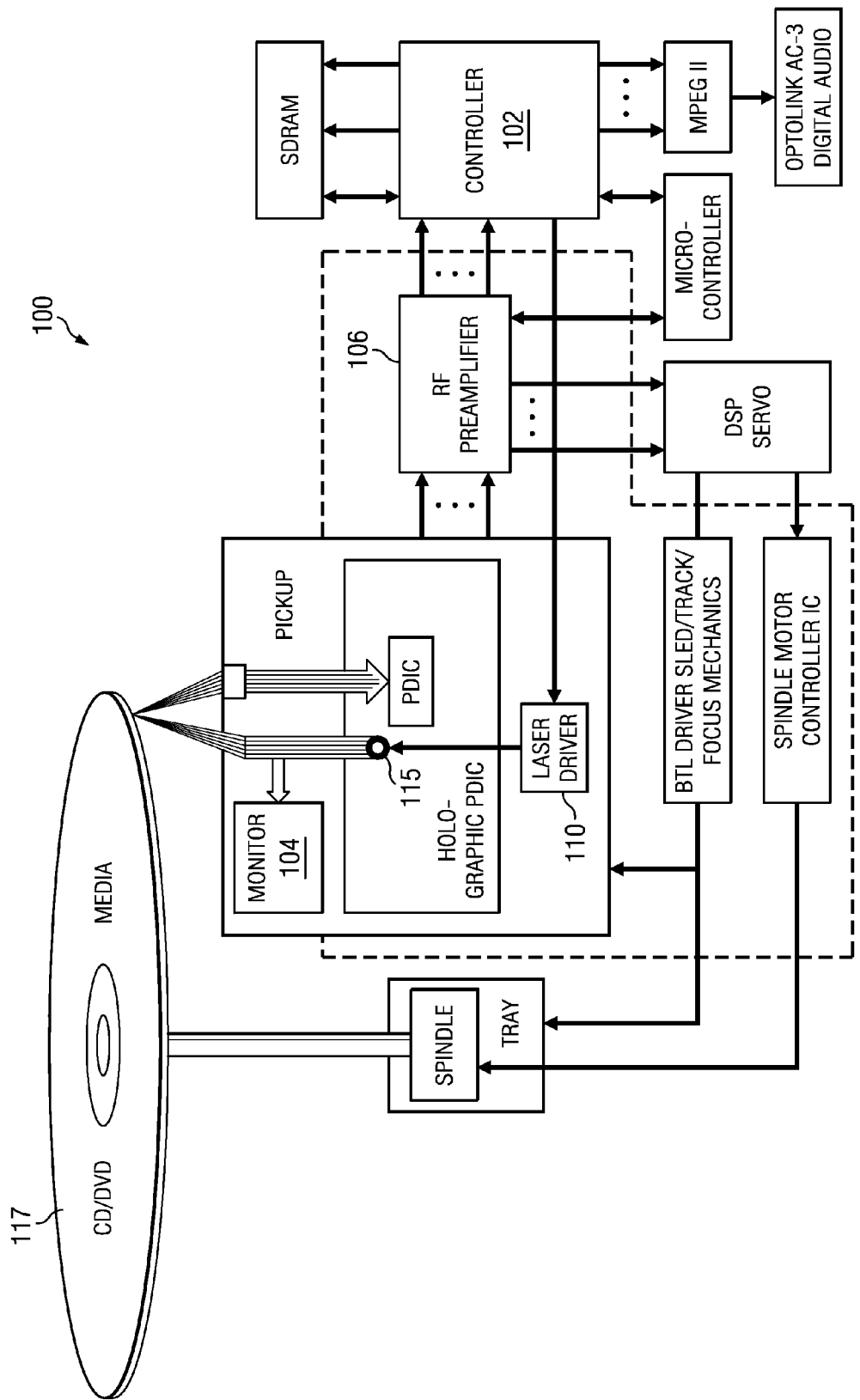
FIG. 1A, is a system drawing illustrating components within an optical disk drive.

While the over current protection device is susceptible to various modifications and alternative forms, specific embodiments have been shown by way of example in the drawings and subsequently are described in detail. It should be understood, however, that the description herein of specific embodiments is not intended to limit the over current protection device to the particular forms disclosed. In contrast, the intention is to cover all modifications, equivalents, and alternatives falling within the spirit and scope of the over current protection device as defined by this document.

DETAILED DESCRIPTION OF EMBODIMENTS

As used in the specification and the appended claim(s), the singular forms "a," "an" and "the" include plural referents unless the context clearly dictates otherwise. Similarly, "optional" or "optionally" means that the subsequently described event or circumstance may or may not occur, and that the description includes instances where the event or circumstance occurs and instances where it does not.

Turning now to FIG. 1A, is a system drawing illustrating components within an optical disk drive 100. A controller 102 monitors the output light power level of a laser diode 115 using a Monitor PD 104, or monitor photodiode, and an RF, or radio frequency, preamplifier 106. This controller can keep an expected power level by changing an input control current of a laser driver 110 through an APC, or auto power controlling, feedback loop, even if a light source 115 such as a laser diode, has many changes of the output power due to various condition changes, such as temperature etc.

Also, the controller 102 sets the enable signal for switching some current channels of the laser driver 110, which arranges data writing pulse. In the case of data reading, the controller 102 may only set the DC current by disabling the switching and applying the indicated input current. In the case data writing, the controller 102 applies some adjustment signals, or enable-switching signals, to arrange the writing pulse waveform as a combination of switching timing, which also changes the power level by different indicated current of each channel. The controller 102 can arrange these indicated currents based on the Monitor PD 104 output with some detecting function in the RF preamplifier 106. At the very least, this controller has two controlling levels for reading power and the writing power. Sometimes it may get the top, bottom, or average level of a writing pulse and calculate to control some power levels independently.

As illustrated in this figure, the laser driver 110 sends a signal that prompts an associated light source 115 (e.g., laser diode) to emit light. The light source 115 may emit light at any of a number of wavelengths (e.g., 400 nm, 650 nm, 780 nm). Light from this source contacts an associated optical media 117, such as a compact disc (CD), blue ray device (Blu-ray), or digital versatile disk (DVD). Light contacting the optical media can either facilitate data storage or data retrieval from the optical media 117.

Figure 1B:
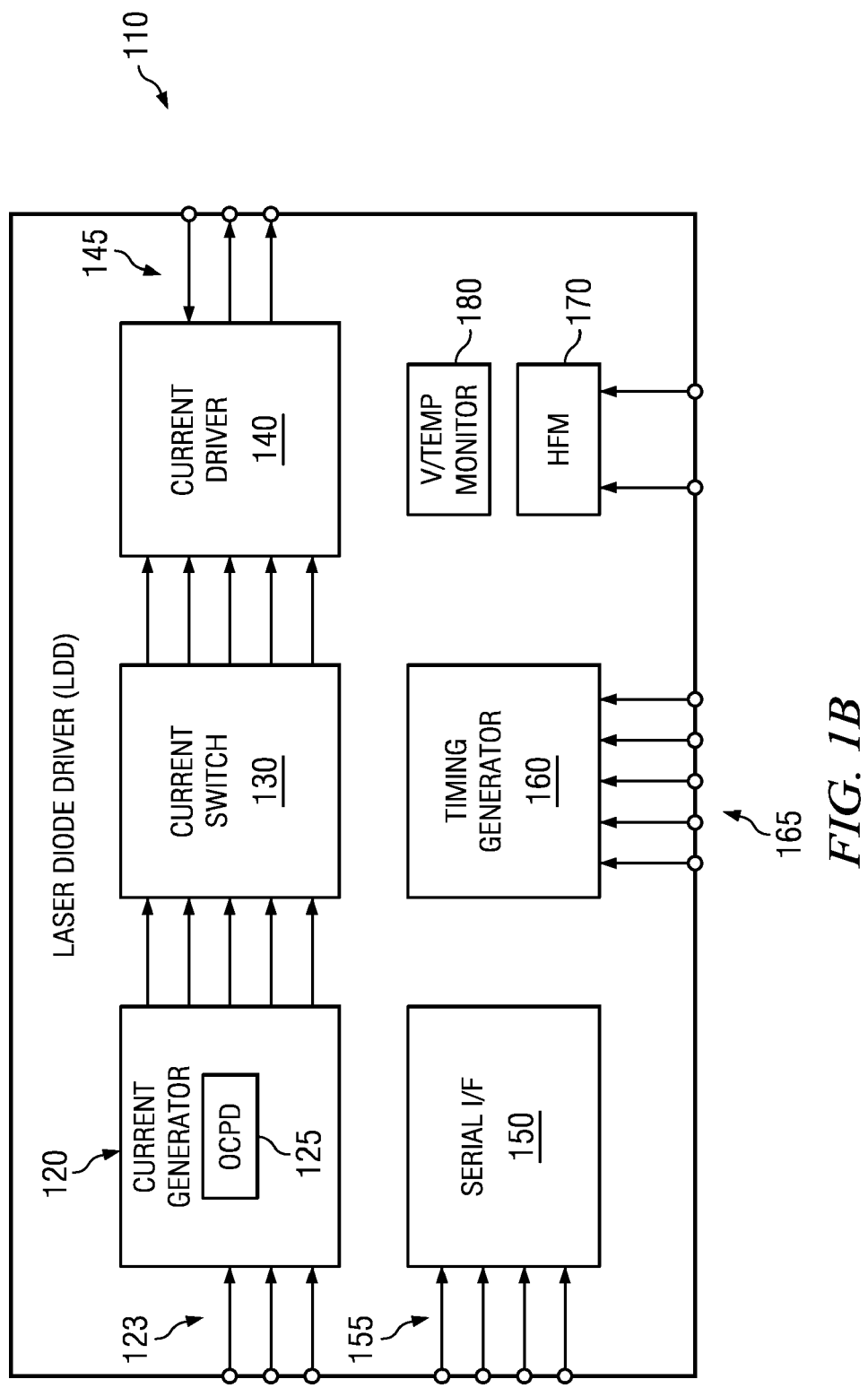
FIG. 1B is an enlarged view of the innovative laser driver of FIG. 1A.

FIG. 1B is an enlarged view of the innovative laser driver 110, which may be a laser diode drive (LDD). The LDD 110 is an integrated, fully programmable, multi-function product that controls and drives laser diodes (e.g., light source 115) within optical drives as described with reference to FIG. 1A. More specifically, the LDD 110 can apply the current for the read, write, and erase removable high capacity disks (e.g., capacities greater than approximately 50 Gbytes/disk). The LDD 110 also has low noise (e.g., noise of approximately 0.5 nA/rt-Hz), high speed (e.g., 1 Gb/s, 0.850 Gb/s) and high current (e.g., approximately 1 amp). Any numbers included in this application are for illustrative purposes only and numerous alternative implementations may result from selecting different quantitative values.

At a high level, the LDD 110 may include a current generator 120. Generally, the current generator 120 receives some input signals 123 associated with several input channels, which have an associated input current. This current generator 120 works in tandem with a current driver 140 and produces a gain for the input current. As a result, the current generator 120 and current driver 140 control the amount of current for each output channel 145. For the input signals that the current generator 120 receives, it transmits output signals that a current switch 130 receives. The current switch 130 decides which of the input channels should be turned on or turned off. For the channels that should be turned on, the current switch 130 makes those channels active. Similarly, the current switch 130 inactivates the channels that should be turned off and transmits output signals reflecting this change. The current driver 140 receives these output signals from the current switch 130 as input signals. The current driver 140 is the last current gain stage and drives the laser diode directly. In other words, the output signals from the current driver 140 also serve as output signals for the LDD 110, which are used in driving the lasers, or the light source 115 (see FIG. 1A).

In addition to the above-mentioned devices, the LDD 110 includes additional components. A serial interface (I/F) 150 has several inputs 155 (e.g., serial data enable, serial data, serial clock) that may be used for an enable, feature selection, or setting the gain. Like the serial interface 150, the timing, generator 160 receives various channel enable inputs 165. Though there are five channel enable inputs that are shown in FIG. 1B, the LDD 110 may have any number of channel enable inputs, such as two, six, or the like. The timing generator 160 determines the time at which a given input channel will be either turned on or turned off. The LDD 110 also includes a high frequency modulator (HFM) 170 and voltage/temperature monitor (V/Temp Monitor) 180. The HFM 170 modulates the output current for mode-hopping noise reduction of the laser diodes. The voltage/temperature monitor 190 monitors the laser diode voltage drop and on-chip temperature. One skilled in the art will appreciate that numerous alternative implementations may result from removing any or several of the blocks within the LDD 110.

Due to the high current gain in laser diode applications, an output current can become very high if input current is not effectively managed. For example, several gain stages can amplify a 10 mA input current to a 1000 mA output current. Transmitting a high current output signal directly to a laser diode can easily destroy this device. The LDD 110 protects an associated laser diode by including an over current protection device (OCPD) 125 within the current generator 120. The OCPD 125 closely monitors the input current associated with the input signal. When the input current exceeds a predetermined limit level, this OCPD can either shut down all of the input channels or switch the over-current channel's output to the predetermined limit level. Additional details regarding how the OCPD 125 monitors the input current and selects the appropriate action is described with reference to subsequent figures.

Figure 2B:
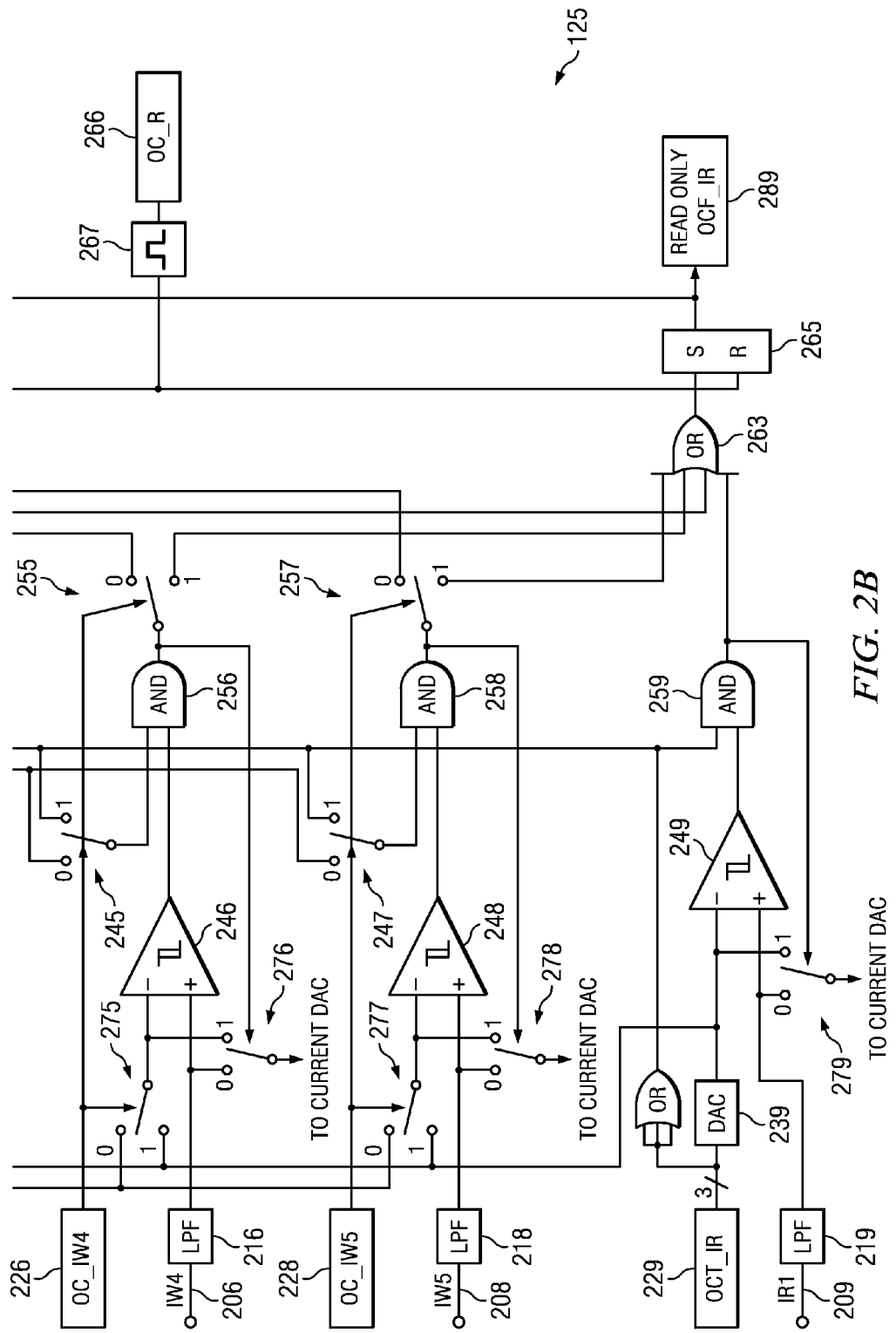

FIGS. 2A-2B are block diagrams illustrating one implementation of the OCPD 125. In this implementation, writing and reading from the optical media 117 (see FIG. 1A) uses five input current channels 202-209. Of these five channels, reading from the optical media 117 only uses channel 209, while the other channels are used in writing. Alternative implementations may include 4, 7, or some other suitable number of input current channels. There are low pass filters 212-219 associated with each of the input current channels 202-209. In selecting an appropriate low pass filter, a designer may consider a cutoff frequency, a stop band attenuation or a dynamic range. The cut-off frequency ranges of these low pass filters may be approximately 3 kHz to approximately 600 kHz. Numerous alternative implementations may result by varying these ranges without departing form the innovative concepts of the OCPD 125. The low pass filters 212-219 effectively remove current spike or glitches that may be present in the input current signal received on the input channels 202-209.

As mentioned with reference to FIG. 1A, the current generator 120 provides some initial gain of the input current for an input signal received on the input channels 202-209. Though not shown in FIG. 1A, the current generator 120 may include a scaler or digital to analog converter (DAC) used in providing this initial current gain. Therefore, the OCPD 125 may be designed without including any gain stages. However, this OCPD may receive signals indicating a maximum permissible current associated with each input current channel. Each input channel may also have a register associated with it for storing this maximum permissible current; these registers are shown with reference numerals 222-229. Though shown as three bit registers, alternative implementations may result using two bit, six bit, or some other suitable number.

In the OCPD 125, the primary write channel is channel 202 and the primary read channel is channel 229. As a signal representing the maximum permissible current comes from the register 222, it encounters a bypass path 230 and the logic gate 231. At a high level, OCPD 125 uses this bypass path and logic gate for disabling over current protection during a write cycle. Similarly, there is a bypass path 235 and logic gate 236 for disabling over current protection during a read cycle. Alternative implementations may vary the number of primary write channels or the number of primary read channels. As a result, each of these primary channels has a digital to analog converter (DAC) associated with it. The write channel 202 has a DAC 232 associated with it, while the read channel 209 has a DAC 239 associated with it.

In cycle, an input signal can enter the OCPD 125 on the channel 202. The low pass filter 212 removes abnormalities (e.g., spikes and glitches) from this signal and transmits a filtered input signal. The register 222 can transmit a threshold signal associated with a maximum permissible current for the channel 202. This threshold signal travels both to the bypass path 230 and the DAC 232. On this bypass path, the logic gate 231 receives the threshold signal. In this implementation, the logic gate 231 is shown as an OR gate, though other types of gates or combinations of gates may be used for the logic gate 231. Since, the input terminals of this logic gate are tied together, the threshold signal on the input terminal passes to this logic gate's output terminal. As the threshold signal encounters the DAC 232, it gets converted to an analog threshold signal.

A comparator 242 receives both the analog threshold signal from the DAC 232 and the filtered input signal from the low pass filter 212. This comparator transmits the higher of these two signals, or a compared signal. A second logic gate 252 receives the threshold signal and, the compared signal. In this implementation, the logic gate 252 is an AND gate, but other types of gates may also be used including combinations of gates. When the compared signal and the threshold signal are both a logic high, the logic gate 252 transmits a logic high to the logic gate 262, which is shown as an OR gate. This logic gate transmits a logic high to the latch 264, which is shown as an SR latch. Though shown as an SR latch, the latch 264 may be any one of various other types of latches, such as D-latch or the like.

In addition, the output signal from the logic gate 252 also gets routed back to as an enable to for a switch 272. As illustrated, this switch has a 0 position and a 1 position, though switches with more than two positions may also be used. Each position of the switch 272 connects to an input terminal of the comparator 242. Consequently, the output signal from the logic gate 252 can be applied to one input terminal of the comparator 242. This is beneficial because a switch 272 can be selected automatically due to the output of the logic gate 252. In an alternative implementation where the input current is larger than threshold current applied by the DAC 232, the output signal from this logic gate can connect to the next output stage by the switch 272 automatically using this threshold current. In addition, the switch 272 connects a current DAC (not shown). This current DAC enables setting a current gain between an input current and output current of the laser diode 115.

As mentioned above, the primary write channel 202 and the primary read channel 209 have similar devices associated with them and operate similarly. In other words, the primary read channel 209 has a DAC 239, comparator 249, logic gate 259, logic gate 263, latch 265, and switch 279. In addition, a current DAC (not shown) connects to the switch 279. While only a single read channel is shown in FIGS. 2A-2B, other implementations may result from using a different number of read channels.

The write channel 204 has several devices associated with it, but also receives an output signal derived from the DAC 232. A switch 273 receives an enable signal from the register 224 that causes this switch to transition between positions, by example is shown as 0 and 1. Thus, the value in this register controls the position of the switch 273. This switch receives on one of its input terminals the output signal derived from the DAC 232, while its other input terminal connects to the input terminals of switch 275, switch 277, and the comparator 249. The devices associated with the write channel are equally applicable to the write channels 206-208.

A switch 243 also receives an enable from the register 224 that controls movement of the switch between a 0 position and a 1 position. One input terminal of the switch 243 connects to the input terminal of the logic gate 252. The switch 243 also connects to an input terminal of the logic gate 254, which is shown as an AND gate by way of an example. A second input to this logic gate connects to an output terminal of the comparator 244. The output terminal of the logic gate 254 serves as an enable for the switch 274. In addition, this output terminal also connects to the switch 253. The output of the logic gate 254 connects to an input of the logic gate 263, which is shown as an OR gate but may be any other type of logic gate. The output of this logic gate connects to an input terminal of the latch 265.

The latch 264 and the latch 265 work in concert in transmitting an over current signal during either a write cycle or a read cycle. The latch 264 connects to the register 282, which may be used in setting a flag associated with over current protection for the write cycle. Similarly, the latch 265 connects to the register 289, which may be used in setting a flag associated with over current protection for the read cycle. Both of these latches receive a reset signal from the register 266, which resets these latches.

The logic gate 284 and the logic gate 286 can transmit an inactivate signal for inactivating channels in the light source 115 (e.g., a laser diode) as a way of protecting this light source from potentially damaging currents. The logic gate 284 has input terminals connected to output terminals of the latches 264, 265. This logic gate is shown as an OR gate, but may be a different type of logic gate. The logic gate 286 receives an output signal from the logic gate 264. Though, shown as an AND gate, this is merely one of the many forms that this logic gate can take.

As the OCPD 125 operates, it creates an inactivate signal that can be used in protecting a light source. Its enable function is controlled by the OR gate 231, AND gate 252 gate as described. In case it is ser 0, this functionality is disabled and the other case (e.g., at least 1 bit is set 1), this function is enabled. Because the output of the OR gate 231 is low when the register 222 is 0, then the input of AND 252 is always low, and does not depend on the output of the comparator 242. At that point, the switch 272 is connected to the LPF 212 output, which means there is no signal to apply the next stage, the current DAC. Also, there is essentially no effect for the next OR gate 242. When it is set to any data value that is not 0, the output of OR gate 231 is always 1, then the output of AND gate 252 depends on the comparator 242 output. In case the signal level after LPF 214 of the input, indicated current on the terminal 202 is smaller than the DAC 252, the output level which was predetermined by the register 222, the output of comparator 252 is low. Then the output of AND gate 252 is low. So the switch 272 connects to LPF output signal, which means the input signal applies to next stage as normal operation. Also, it is no effect for the next OR gate 242.

If there is some larger input of LPF 212, this means there is a larger output of the LPF 212. The output of comparator 242 switches to high, then the output of AND gate 252 changes to high. Then the switch 272 sets to the output of the current DAC, which means the predetermined threshold level as limiter because of larger input current. So it can keep the limited output current of the laser diode 115. And the output of next gate OR 242 changes to high, then the flag-register 282 is set and switches off the current output, which was made from this input current when this function is enabled by the register OC_PM 288. If the register 288 is set to enable, a large input current results. Then one can turn off the output for the laser diode 115 and protect it from this unexpected input. Regarding register 229, or OCT_IR, it can function fairly similarly to the register 222. On the other hand, the other three registers are shown as follow: OC_IW3 (224), OC_IW4 (226), OC_IW5(228); each can set only the selectable of DAC output of the DAC 252 or the DAC 239 independently. These three detectors are for these three inputs but the threshold level is same as the selected DAC.

In the a disk drive system, there are two basic functions for data reading and data writing. In case of reading; one can set only DC output power level using IR1 (209) input. For reading, one can use only the output current generated from IR1 (209). For that case, one can use the over current detector which described in blower line of the block diagram with reference numerals 209, 219 . . . . On the other hand, for writing, there should be at least two input currents as IR1 209 and IW2 (202), for example. In this case, one can set the DC current from IR1 (209) and the pulse current from IW2 (202). One sets an independent threshold of this detector on DAC 232 and DAC 239 as a suitable level for each setting power level. Then one can use two detector functions explained with reference to line 202 and line 209.

In contrast, the other three write inputs of IW3 (204), IW5 (206), IW5 (207) are option current and make any additional pulse or additional DC level when data writing. Then these channels have essentially the same limitation current, of IR1 (209) or IW2 (202) which is selected by registers (224, 226, 228) with the larger input signal. The same threshold level can be used in comparing and setting the output for next stage when it get larger input. In, the system, it has APC functionality for maintaining an expected power level. If the serve control is out of controlling by any accident (e.g., Monitor PD has with no output, larger data is set on the control input because of a condition etc), a larger input should be used for safely protecting the laser diode (115). To do this, one can set the output flag to switch off the Laser diode output as after gate circuit. There may be two independent flags. Flag (289) shows the detected over current caused from the IR1 (209), a selected input of IW3 (224), IW4 (206), IW5 (228) related with IR1 (209). Flag (282) shows the detected over current cause from the IW2 (202) or a selected input of IW3 (224), IW4 (206), IW5 (228) related with IW2 (202). The reset 266 and laser output off function is for both IR1 (209) and IW2 (202), as well as the selected inputs related to them. If at least one of these has a large input signal, it can switch off the laser output when set the register (266) and immediately stop the over current situation. Otherwise, the laser diode output can keep the threshold current of each channel.

Figure 3:
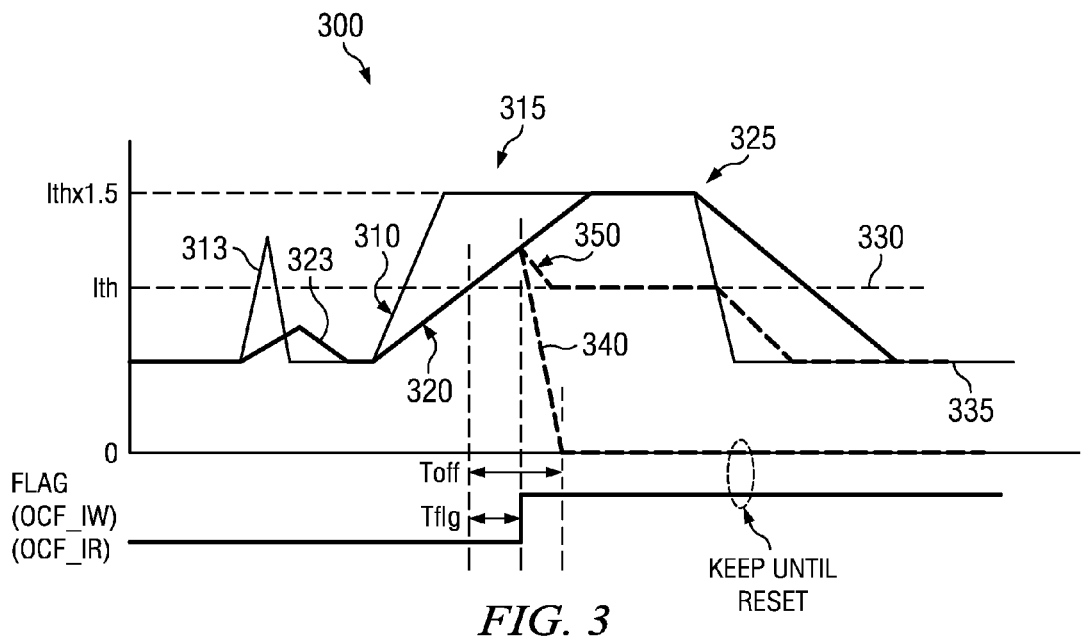
FIG. 3 is a graph illustrating a variation of the normalized current with time for both an input current signal and an output current signal.

FIG. 3 is a graph 300 illustrating a variation of the normalized current with time for both an input current signal and an output current signal. The input current signal is shown by the signal 310. This input current signal includes a spike 313 that could be potentially dangerous for the light source 115. When this input current signal passes through any of the low pass filters 212-219 of FIGS. 2A-2B, the filtered current signal 320 results, which has a substantially lower peak 323. In addition, the input current signal 315 peaks again at peak 315. This peak corresponds to the peak 325 of the filtered current signal 320. As can be seen with both of these peaks, the low pass filters slow the rise of the corresponding input signal and keep it below a current threshold 330 for a longer period of time.

As described with reference to FIGS. 2A-2B, the OCPD 125 uses flags in activating over current protection for an output current signal. In one implementation, the OCPD 125 may completely inactivate all of the channels after setting an over current; flag as shown with the signal 340. In this implementation, the output current signal goes to zero. An alternative implementation may result in reducing the output current signal to a preset limit, as illustrated with the signal 350. For this signal, setting the flag, quickly reduces the output current to a threshold current 330 and then later reduces it to the preset current limit 335. An alternative implementation may result by simply reducing an output current signal to a preset limit immediately without reducing it to a current threshold first.

Figure 4:
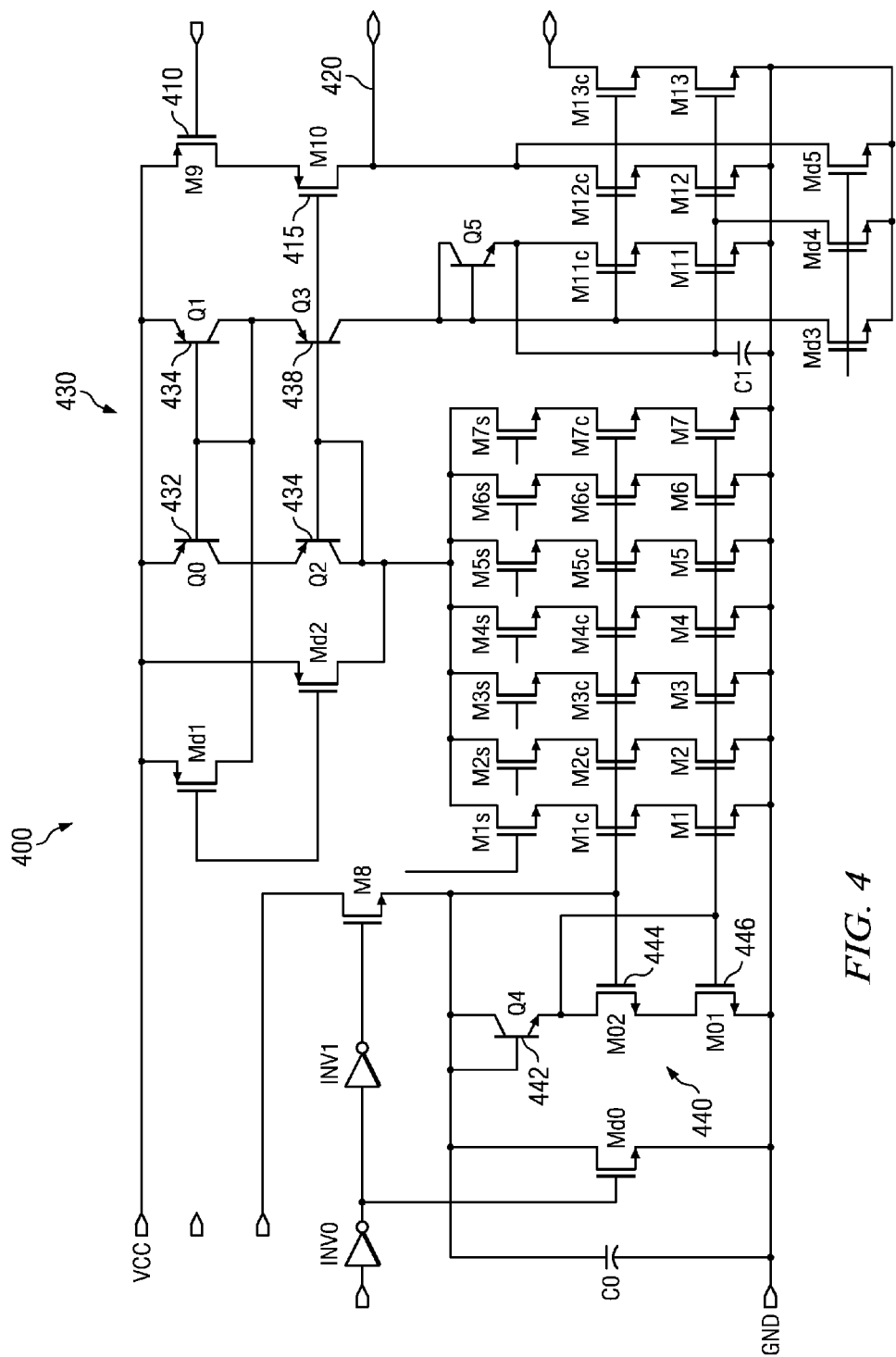
FIG. 4 is a circuit diagram of one implementation of any one of the current DACs of FIGS. 2A-2B that includes a current mode comparator with hysteresis.

FIG. 4 is a circuit diagram 400 of one implementation of any one of the current DACs of FIGS. 2A-2B that includes a current mode comparator with hysteresis. Device 410 and device 415 may be used for hysteresis. In addition, terminal 420 may be the current comparator output, while terminal 425 may be used for applying a preset current limit. Within this current DAC, there is a differential pull up 430, which includes devices 432-438. This current mode DAC also includes a cascode bias pull-down 440, made up of devices 442-446. In an alternative embodiment, the current DAC may include one or more of the following: the differential pull up, the cascade bias pull down, the two transistors for hysteresis.

Figure 5:
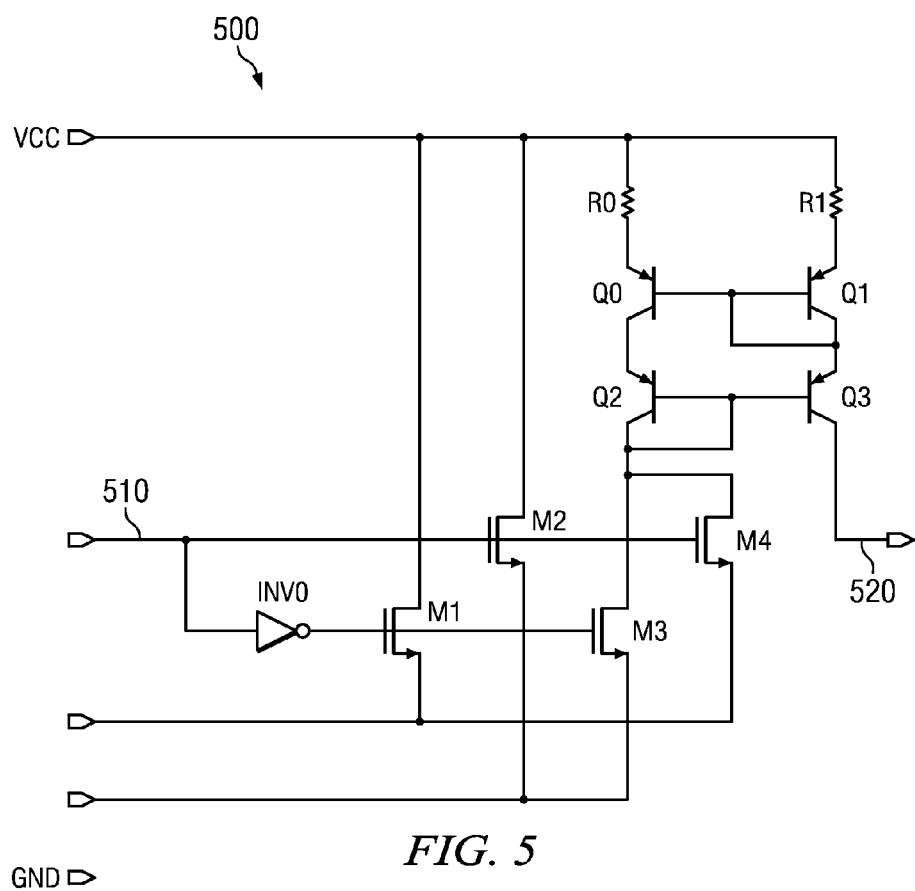
FIG. 5 is a circuit diagram for an implementation of an output current switch that connects to the current DAC of FIGS. 2A-2B.

FIG. 5 is a circuit diagram 500 for an implementation of an output current switch that connects to the current DAC. In other words, this circuit diagram may be used for any one or more of the following switches 272, 274, 276, 278, and 279. This current switch receives an enable signal on terminal 510, while receiving a reference input current signal (inIref) on a terminal 512, and a read/write input current signal (inIRW) on the terminal 514. This current switch produces an output current signal on the terminal 520. The value of the enable signal on the terminal 510 determines the output current signal applied to terminal 520. For example, when the enable signal has one value, the output current signal may be approximately equal to the reference input current signal (inIref). Alternatively, the output current signal may be approximately the read/write input current signal (inIRW).

Figure 6:
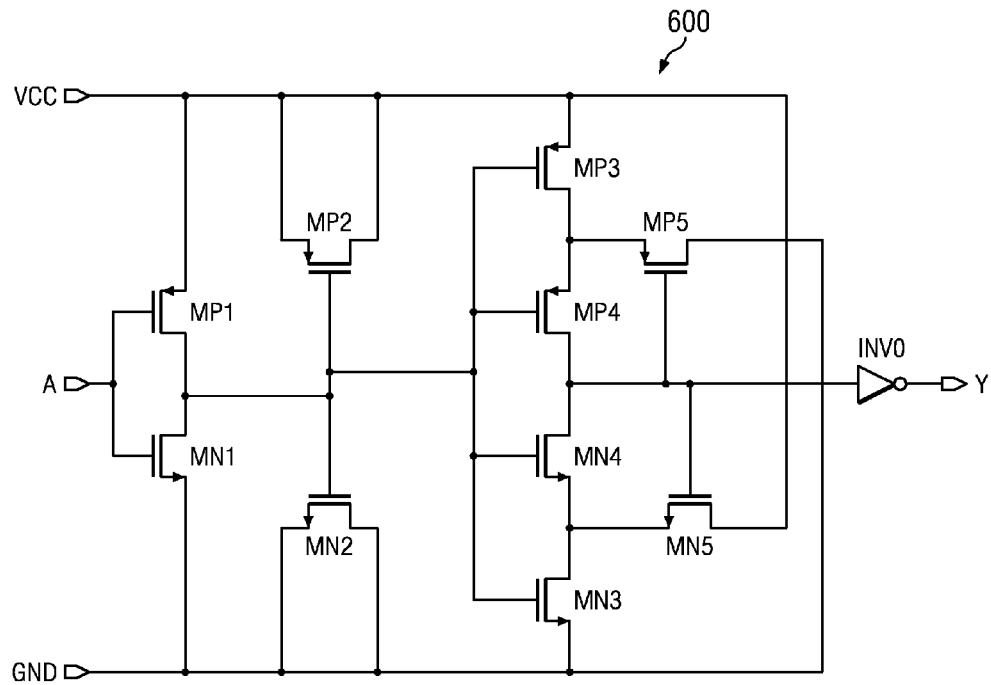
FIG. 6 is a circuit diagram of one of the many implementations of a one shot circuit used in resetting the latches of FIGS. 2A-2B.
Figure 7:
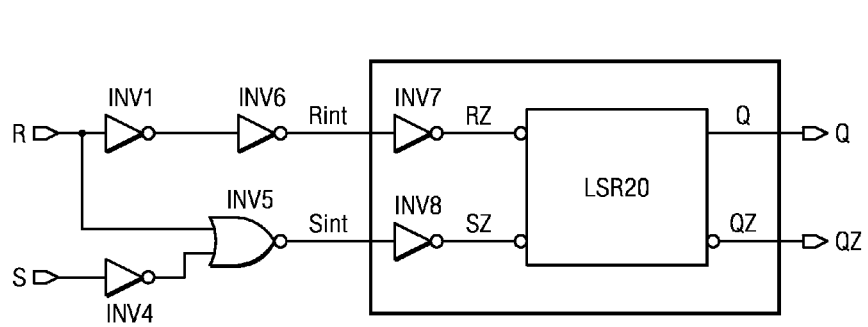
FIG. 7, is one implementation of a logic diagram 700 for one of the latches of FIGS. 2A-2B.

As mentioned with reference to FIGS. 2A-2B, there is a block 267 that controls the shape of the pulse used in resetting the latch 264 and the latch 265. FIG. 6 is a circuit diagram 600 of one of the many implementations of a one shot circuit used in resetting these latches. This circuit diagram generally includes an RC delay with a Schmitt trigger. In one implementation the delay may be approximately 3 ns delay, 2 ns delay, or the like. Turning now to FIG. 7, this figure illustrates one implementation of a logic diagram 700 for a latch, like the latches 264-265. More specifically, this implementation does not allow both of the inputs to have a logic high state at the same time. In other words, this logic gate has "11" prevention.

The OCPD 125 offers an on-chip, low-pass filter that filters out the glitch and current spikes, which can damage fragile light sources, such as light emitting diodes. Also all the signal processing is done within current domain, therefore it offers accuracy and speed, advantages. Finally, the OCPD 125 is implemented for all current channels. Therefore, possibility for an over current condition is essentially limited. Finally, the OCPD 125 achieves these without sacrificing reliability.

While various embodiments of the over current protection device have been described, it may be apparent, to those of ordinary skill in the art that many more embodiments and implementations are possible that are within the scope of this system. Although certain aspects of the over current protection device may be described in relation to specific techniques or structures, the teachings and principles of the present system are not limited solely to such examples. All such modifications are intended to be included within the scope of this disclosure and the present over current protection device and protected by the following claim(s).

The invention claimed is:

1. An over current protection device for use with a laser diode driver, comprising:
a plurality of input channels for receiving an input signal;
a plurality of low pass filters coupled to a first group of the plurality of input channels, wherein each low pass filter is associated with one input channel within the first group of input channels, the plurality of low pass filters operative for removing spikes associated with the input signal;
a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level; and
wherein the over current protection device is on chip with the laser diode driver.

2. The over current protection device of claim 1 further comprising a logic device having a plurality of gates selected from the group consisting of AND gates, and OR gates.

3. The over current protection device of claim 2 further comprising two latches coupled to the logic device.

4. The over current protection device of claim 1 further comprising a bypass device coupled to at least one of the digital to analog converters, wherein the bypass is operative for disabling the over current protection device.

5. The over current protection device of claim 4, wherein disabling the over current protection device comprises causing an output current signal to have either a value or a zero or a preset current limit.

6. The over current protection device of claim 5, wherein the output current signal is approximately equal a reference input signal or a read/write input current signal.

7. The over current protection device of claim 1 further comprising a first current digital to analog converter (DAC) selectively coupled to at least one of the plurality of digital to analog converters, wherein the first current DAC includes a device selected from the group consisting of a differential pull up, cascode bias pull-down, and devices for hysteresis.

8. The over current protection device of claim 1, further comprising a pair of latches for receiving the over current protection.

9. The over current protection device of claim 8, further comprising a one shot circuit for resetting the latches, wherein the one shot circuit comprises an RC delay and a Schmitt trigger.

10. The over current protection device of claim 8, wherein at least one of the latches generally does not allow both of its inputs to have a logic high state at essentially the same time.

11. A driver for use with at least one laser diode, the laser diode driver, comprising:
   a current generator operative for creating a plurality of generated current signals in response to receiving a plurality of input signals,
   wherein the current generator includes an over current protection device, comprising:
      a plurality of input channels for receiving an input signal;
      a plurality of low pass filters coupled to a first group of the plurality of input channels, wherein each low pass filter is associated with one input channel within the first group of input channels, the plurality of low pass filters operative for removing spikes associated with the input signal; and
      a plurality of digital to analog converters coupled to a second group of the plurality of input channels, wherein each digital to analog converter is associated with one low pass filter in the second group of input channels, the digital to analog converters operative for triggering over current protection when a signal received from the associated low pass filter is beyond a preset level, and
      the over current protection device is on chip with the laser diode driver.

12. The driver of claim 11 further comprising a current switching device coupled to receive the generated current signals and operative for generating switched signals.

13. The driver of claim 12 further comprising a current driver coupled to received the switched signals and operative for amplifying the switch signals to drive the at least one laser diode.

14. The driver of claim 12, further comprising a device selected from the group consisting of a serial interface device, a timing generator, a high frequency modulator, and a voltage/temperature monitor.

15. An optical disk drive system, comprising:
   a controller monitoring an output power lever of a laser diode and transmitting adjustment signals for varying the output power level;
   a laser driver operatively coupled to the controller for receiving the adjustment signals, the laser driver having an over current protection device, comprising:
      a plurality of input channels for receiving an input signal;
      a plurality of low pass filters coupled to a first group of the plurality of input channels, wherein each low pass filter is associated with one input channel within the first group of input channels, the plurality of low pass filters operative for removing spikes associated with the input signal;
      a plurality of digital to analog converters coupled to a second group of the plurality of input channels, wherein, each digital to analog converter is associated with one low pass filter in the second group of input channels, the digital to analog converters operative for triggering over current protection when a signal received from the associated low pass filter is beyond a preset level, and
      the over current protection device is on chip with the laser diode driver.

16. The optical disk drive system of claim 15, wherein the over current protection device further comprises a plurality of comparators, wherein each comparator is associated with one low pass filter and one digital to analog converter.

17. The optical disk drive system of claim 15, further comprising a radio-frequency preamplifier detecting some signals from the laser diode.

* * * * *